United States Patent
Grivna et al.

(10) Patent No.: US 7,939,897 B2
(45) Date of Patent: May 10, 2011

(54) METHOD OF FORMING A LOW RESISTANCE SEMICONDUCTOR CONTACT AND STRUCTURE THEREFOR

(75) Inventors: Gordon M. Grivna, Mesa, AZ (US); Prasad Venkatraman, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/766,601

(22) Filed: Apr. 23, 2010

(65) Prior Publication Data

US 2010/0219531 A1 Sep. 2, 2010

Related U.S. Application Data

(62) Division of application No. 11/232,757, filed on Sep. 23, 2005, now Pat. No. 7,736,984.

(51) Int. Cl.
*H01L 21/02* (2006.01)

(52) U.S. Cl. ...... 257/382; 257/328; 257/329; 257/335; 257/341; 257/342; 257/383; 257/384; 257/385; 257/401; 257/550; 257/754

(58) Field of Classification Search ......... 257/328–329, 257/335, 341–342, 382–385, 401, 550, 754
See application file for complete search history.

(56) References Cited

U.S. PATENT DOCUMENTS

| | | | | |
|---|---|---|---|---|
| 4,879,254 | A | 11/1989 | Tsuzuki et al. | 438/273 |
| 4,960,723 | A | 10/1990 | Davies | |
| 5,182,222 | A | 1/1993 | Malhi et al. | 438/273 |
| 5,578,873 | A | 11/1996 | Manning | |
| 5,729,055 | A | 3/1998 | Manning | |
| 5,874,341 | A | 2/1999 | Gardner et al. | 438/301 |
| 5,885,897 | A | 3/1999 | Igel | 438/656 |
| 5,933,734 | A | 8/1999 | Ferla et al. | 438/268 |
| 5,949,114 | A * | 9/1999 | Ma | 257/384 |
| 6,054,737 | A * | 4/2000 | Magri' et al. | 257/341 |
| 6,144,065 | A | 11/2000 | Kinzer | 257/327 |
| 6,197,640 | B1 | 3/2001 | Davies | |
| 6,391,750 | B1 | 5/2002 | Chen et al. | 438/583 |
| 6,444,574 | B1 | 9/2002 | Chu | |
| 6,686,614 | B2 * | 2/2004 | Tihanyi | 257/155 |
| 6,992,353 | B1 | 1/2006 | Wu | 257/335 |
| 7,129,548 | B2 | 10/2006 | Chan et al. | 257/382 |
| 7,211,515 | B2 | 5/2007 | Lee et al. | 438/682 |
| 7,217,657 | B2 | 5/2007 | Wieczorek et al. | 438/664 |
| 2004/0108548 | A1* | 6/2004 | Cai | 257/335 |
| 2004/0262680 | A1 | 12/2004 | Ehwald et al. | 257/335 |
| 2006/0240625 | A1 | 10/2006 | Loechelt et al. | 438/268 |

* cited by examiner

*Primary Examiner* — Kevin M Picardat
*Assistant Examiner* — Bac H Au
(74) *Attorney, Agent, or Firm* — Robert F. Hightower

(57) ABSTRACT

In one embodiment, silicide layers are formed on two oppositely doped adjacent semiconductor regions. A conductor material is formed electrically contacting both of the two silicides.

7 Claims, 3 Drawing Sheets

METHOD OF FORMING A LOW RESISTANCE SEMICONDUCTOR CONTACT AND STRUCTURE THEREFOR

The present application is a divisional application of prior U.S. application Ser. No. 11/232,757, filed on Sep. 23, 2005 now U.S. Pat. No. 7,736,984 which is hereby incorporated by reference, and priority thereto for common subject matter is hereby claimed.

BACKGROUND OF THE INVENTION

The present invention relates, in general, to electronics, and more particularly, to methods of forming semiconductor devices and structure.

Previously, the semiconductor industry utilized various methods and structures to form vertical metal oxide semiconductor (MOS) transistors. These vertical transistors generally utilized a doped portion of the semiconductor substrate to form a source contact region for the transistor and formed a body region of the transistor within the source contact region. A source electrode usually was formed to electrically contact both the source region and the body contact region. An example of such a vertical transistor is disclosed in U.S. Pat. No. 4,960,723 which issued to Robert B. Davies on Oct. 2, 1990 which is hereby incorporated herein by reference. The resistance from the source electrode to the source region and the body region often affected the performance of the transistor. The greater the resistance the lower the performance. In one implementation, an opening was formed through the source region to expose a portion of the body contact region and a metal was formed on both the source region and the body contact region to function as the source electrode. Often, there was a high resistance to either the source region or the body contact region.

Accordingly, it is desirable to have a method and structure that provides a low resistance current path and a low contact resistance to both the source region and body region of a transistor and that provides a low resistance contact to two adjacent differently doped regions.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
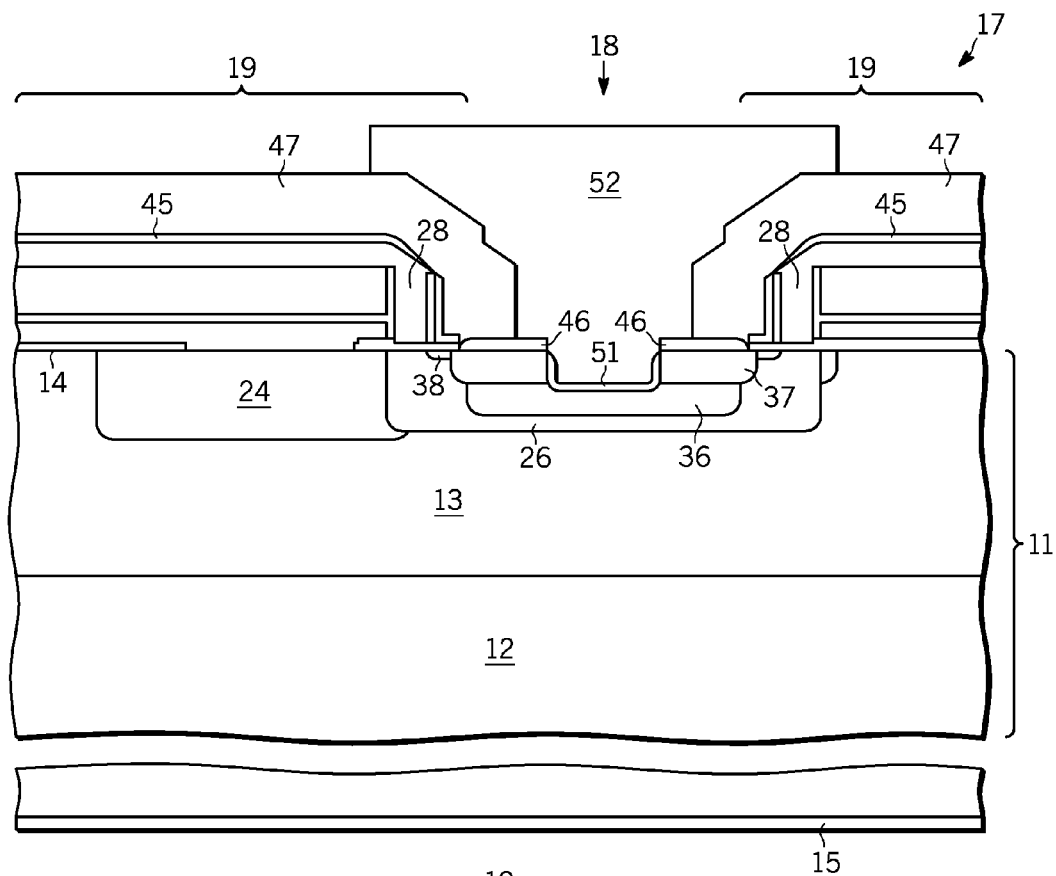
FIG. 1 illustrates an enlarged cross-sectional portion of an exemplary embodiment of a portion of a semiconductor device in accordance with the present invention.

FIG. 1 illustrates an enlarged cross-sectional portion of an exemplary embodiment of a portion of a semiconductor device 10 that includes a semiconductor contact and electrode system 18. Semiconductor contact system 18 is pointed out in a general manner by an arrow. For the exemplary embodiment of device 10 illustrated in FIG. 1, device 10 is a multi-cell vertical transistor that includes a plurality of transistor cells such as a transistor 17 that are formed on a semiconductor substrate 11. Transistor 17 is pointed out in a general manner by an arrow. Transistor 17 functions as a portion of the plurality of transistor cells that are interconnected to form a larger vertical transistor such as a vertical power transistor. Vertical power transistors having a plurality of vertical transistor cells are well known to those skilled in the art. Transistor 17 includes a gate structure 19 of transistor 17. Gate structure 19 includes a conductive shield 29 to minimize capacitive coupling to substrate 13. Shield 29 reduces the gate-to-drain capacitance of transistor 17. Such conductive shields are well known to those skilled in the art. As will be seen further hereinafter, contact and electrode system 18 forms a reliable low resistance electrical connection to both the body region and the source region of transistor 17. In the exemplary embodiment illustrated in FIG. 1, transistor 17 is formed in a closed geometric shape such as a circle, hexagon, or other closed geometric shape. For example, if transistor 17 has a circular shape, a plan view of structure 19 may appear as a doughnut shape. Transistor 17 also typically includes a drain electrode 15 on a second surface of substrate 11.

Figure 2:
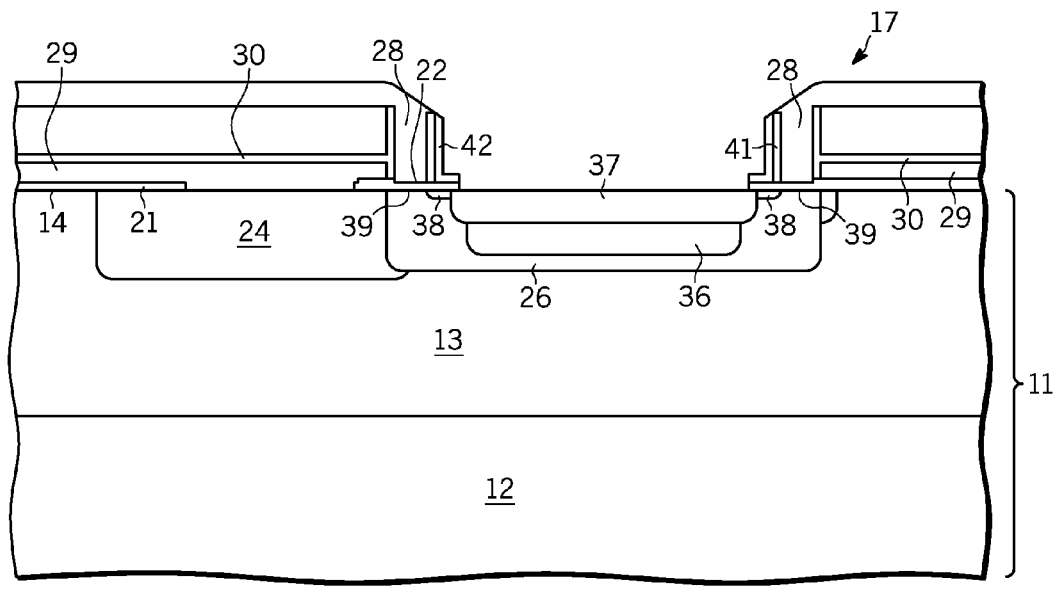
FIG. 2 illustrates an enlarged cross-sectional portion of the semiconductor device of FIG. 1 illustrating portions of a stage of an embodiment of a method of forming the semiconductor device FIG. 1 in accordance with the present invention.

FIG. 2 illustrates an enlarged cross-sectional view of a portion of device 10 illustrating portions of a stage of an embodiment of a method of forming device 10. This description has references to FIG. 1 and FIG. 2. At the stage illustrated in FIG. 2, most of the active portions of transistor 17 are previously formed. Substrate 11 typically includes a bulk semiconductor substrate 12 having an epitaxial layer 13 formed on one surface of substrate 12. Substrate 11 has an upper surface or top surface 14 on which portions of transistor 17 are formed. In some embodiments, layer 13 may be omitted and a top surface of bulk substrate 12 would serve as surface 14. An oxide layer 21 generally is on surface 14 to protect substrate 11 during semiconductor processing operations. Previously to the stage illustrated in FIG. 2, a portion of surface 14 of substrate 11 was doped to form a doped region 24 that assists in increasing the breakdown voltage of device 10. Region 24 usually has a doping type that is opposite to the doping type of layer 13. A portion of surface 14 is doped to form a drift region 26 extending from surface 14 into substrate 11. Region 26 will function as a drift region for transistor 17. As is well known in the art, region 26 typically overlies region 24 and in some embodiments region 26 is independent of region 24. A portion of region 26 is doped to form a first doped region 36 extending a first distance into substrate 11. Region 36 will subsequently function as a body contact region for transistor 17. Typically, region 36 has the same doping type as region 26 but has a higher doping concentration. A second doped region 37 is formed to extend from surface 14 a second distance into substrate 11 and to overlap at least a portion of region 36. In other embodiments, region 37 may be adjacent to and electrically contact region 36. Region 37 will subsequently function as a source contact region for transistor 17. A doped region 38 is formed extending from surface 14 into region 26 and overlapping region 37. At least a portion of region 38 typically extends outside of region 37 so that a portion of region 38 electrically contacts region 26. This portion of region 38 functions as the active source region of transistor 17. In other embodiments, region 37 may not be used. A portion of region 26 between region 38 and the edge of region 26 functions as a channel region 39 of transistor 17.

Subsequently, gate structure 19 is formed overlying a portion of corresponding region 38 and channel region 39. A portion of gate structure 19 is formed to overlie channel region 39 and function as a gate electrode or gate 28 for transistor 17. A gate insulator 22 remains on surface 14 underlying gate 28 and overlying a portion of channel region 39. A silicon dioxide spacer or oxide layer 41 may be formed along the sidewalls of gate 28. Spacer 41 generally is used during the formation of region 38 or region 37 to assist in self-aligning regions 37 and 38. Spacer 41 also assists in isolating gate 28 during subsequent operations to form a silicide on region 37. A silicon nitride spacer or nitride spacer 42 may be formed abutting spacer 41. Spacer 42 typically is used during previous processing operations to assist in the formation of regions 37 and 36. Processing operations that can be utilized for the formation of regions 26, 36, 37, and 38 along with spacers 41 and 42 are well known to those skilled in the art. For example, regions 26, 36, and 38 may be formed by masking or self-aligned by spacers and ion implantation, and spacers 41 and 42 may be formed by formation of respective oxide and nitride layers followed by anisotropic etching.

Figure 3:
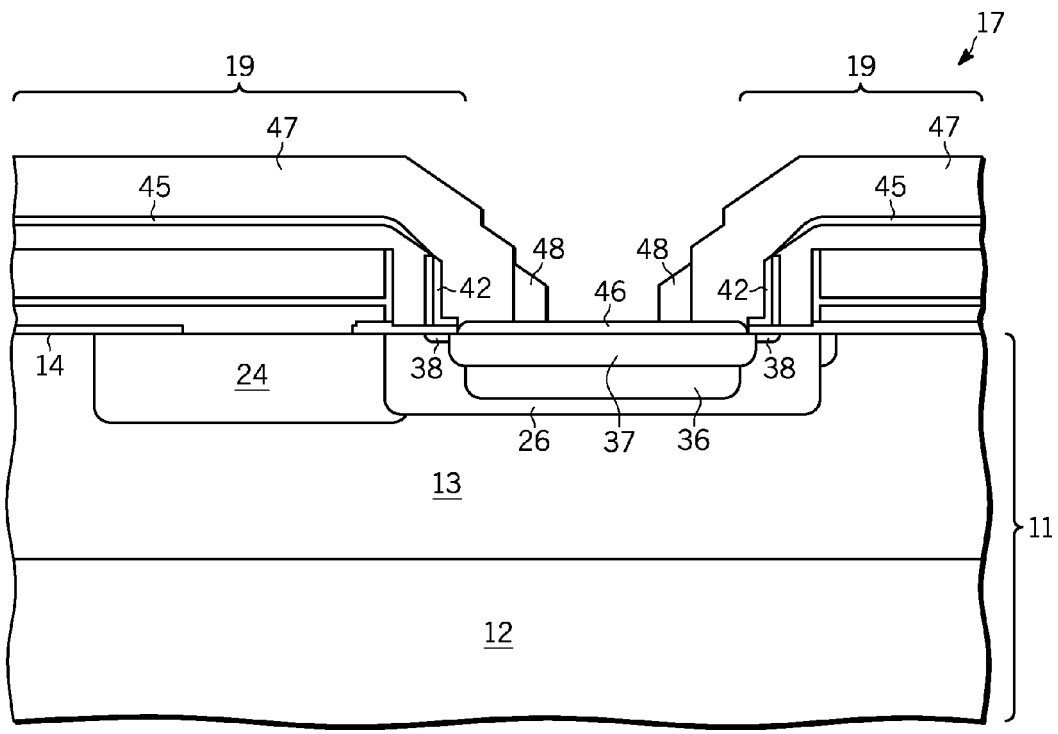
FIG. 3-FIG. 5 illustrate enlarged cross-sectional portions of the semiconductor device of FIG. 1 illustrating portions of subsequent stages according to an embodiment of a method of forming the semiconductor device of FIG. 1 in accordance with the present invention.

FIG. 3 illustrates an enlarged cross-sectional view of a portion of device 10 at a subsequent stage of an embodiment of a method of forming device 10 and transistor 17. After a high temperature anneal has activated the dopants, a silicide layer 45 is formed on the exposed surfaces of gate structure 19 and a first silicide layer or first silicide 46 is formed on region 37. First silicide 46 is formed from a metal that results in a low resistance electrical connection to region 37. In the preferred embodiment, region 37 is doped N-type and silicide 46 is titanium silicide. Silicide 46 is used to provide a local interconnect to region 38. Spacers 42 ensure that silicide 46 is not wider than region 37. Thereafter, a dielectric layer 47, such as silicon dioxide, for gate structure 19 is formed to cover layer 45, spacer 42, and typically extend a first distance onto layer 46. In some embodiments, layer 47 may not extend onto layer 46.

Protective spacers 48 are then formed on layer 46 to form an opening overlying at least a portion of region 36. Spacers 48 may be formed by a variety of methods that are well known to those skilled in the art. For example, a layer of silicon nitride may be formed on layers 46 and 47, and an anisotropic etch may be utilized to remove portions of the silicon nitride layer on silicide 46 to leave spacers 48 on a portion of layer 46. Spacers 48 form an opening overlying the portion of region 36 where a low resistance electrical contact is to be formed.

Figure 4:
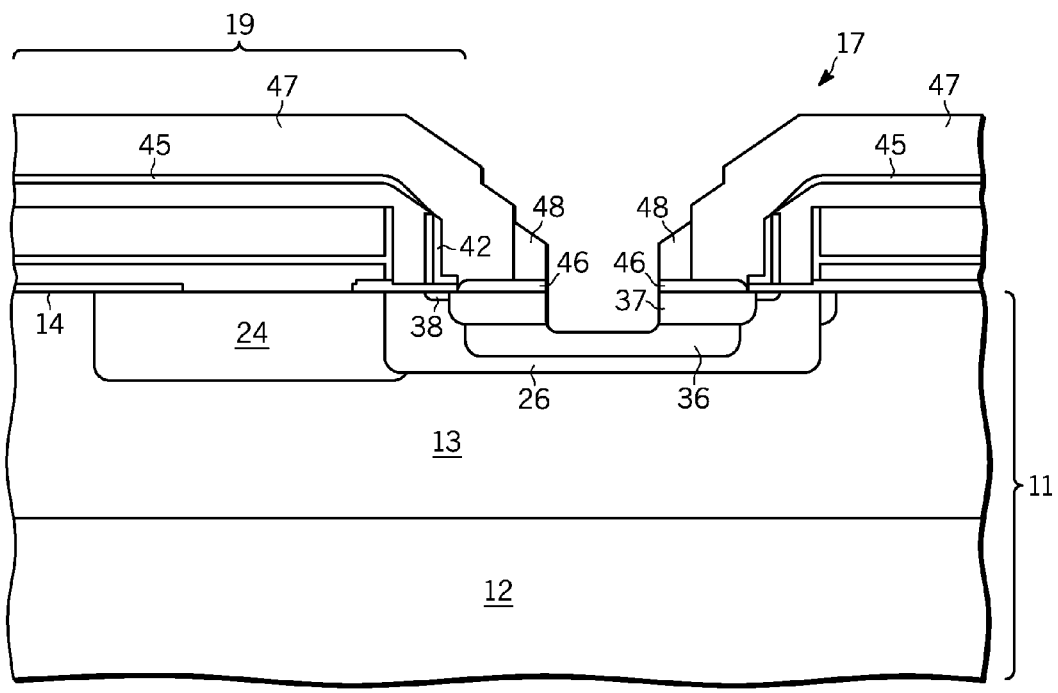

FIG. 4 illustrates an enlarged cross-sectional view of a portion of device 10 at a subsequent stage of an embodiment of a method of forming device 10 and transistor 17. An opening is formed through silicide 46, through region 37, and exposing a portion of region 36. Typically, the opening is formed to extend into region 36 forming a recessed area in region 36. The opening through region 37 exposes the sidewalls of region 37 and can be defined through spacers 48 or with separate photoresist mask layer.

Figure 5:
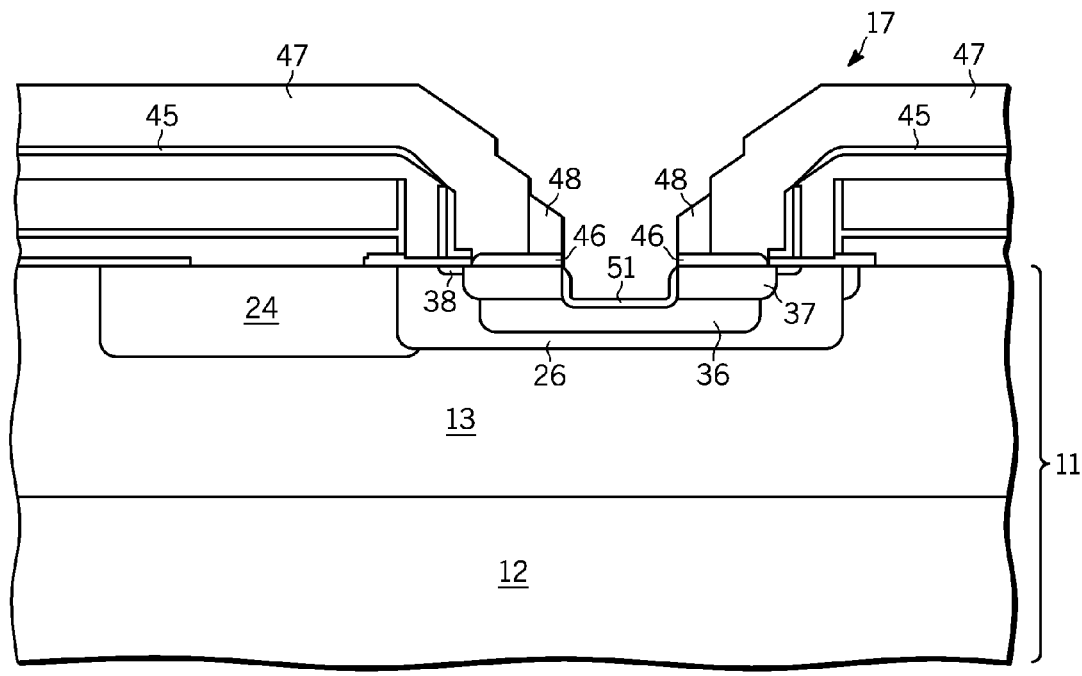

FIG. 5 illustrates an enlarged cross-sectional view of a portion of device 10 at another subsequent stage of an embodiment of a method of forming device 10 and transistor 17. A second silicide layer or second silicide 51 is formed on the exposed portion of region 36. Because region 36 and region 37 have a different doping type, it is difficult to form one silicide that has a low resistance connection to both region 36 and region 37. However, a portion of silicide 51 may be formed along the exposed sidewalls of region 37. Silicide 51 is formed from a metal that forms a low resistance electrical connection to the material of region 36. In the preferred embodiment, region 36 is doped P-type and silicide 51 is platinum silicide, however, other metals may be used to form a different type of silicide that makes a low resistance connection to region 36. Although the portion of silicide 51 on the sidewalls of region 37 may not form a low resistance electrical connection thereto, it should be noted that silicide 46 formed on the surface of region 37 makes a low resistance connection to region 37. Subsequently, spacers 48 are removed. Alternatively, spacers 48 can be retained if spacers 48 are made of a conductive material such as tungsten (W) or tungsten silicide (WSi) and the like. Those skilled in the art will appreciate that spacers 48 may also be removed prior to forming silicide 51 such as by removing spacers 48 after forming the opening through layer 37 and exposing the portion of region 36. The contact structure is formed in the contact opening in dielectric 47 that is overlying regions 36 and 37.

The low resistance electrical connection formed by silicides 46 and 51 form a source and body contact structure for transistor 17. The contact structure of silicides 46 and 51 form a reliable low resistance electrical connection to the stepped areas of regions 37 and 36. Silicide 46 also provides a low resistance local interconnect path to the source formed by region 38. This assists in reducing the source resistance for transistor 17. Note that since the source formed by region 38 is moved away from gate 28, the lateral resistance of the source is an important parameter. Thus, silicide 46 provides lower source resistance and also improves processing. Since high temperature process steps generally should not be used after forming a silicide, it is usually is not possible to further dope and anneal the exposed portion of region 36, thus, using silicide 51 assists in forming the low resistance connections without disturbing the low resistance connection provided by silicide 46.

Those skilled in the art will appreciate that a single silicide or other metal connection such as aluminum-silicon alloy may be used for silicides 46 and 51 instead of the two silicides 46 and 51. The electrical resistance of a single silicide may not be as low as that provided by silicides 46 and 51.

Referring back to FIG. 1, a conductor material 52 is formed to electrically connect to silicide 46 and silicide 51 thereby forming a low resistance electrical connection to region 37 through silicide 46 and a low resistance electrical connection to region 36 through silicide 51. The contact structure of silicides 46 and 51 along with the electrode formed by material 52 functions as a semiconductor contact and electrode system 18. Conductor material 52 may be any of a variety of conductive materials that are used in semiconductor processing such as titanium, titanium tungsten, aluminum, or an aluminum alloy. Using two different silicides for the two differently doped semiconductor regions facilitates making the contact structure that forms the low resistance electrical connection to both doped regions. In one example embodiment, the contact structure of silicides 46 and 51 reduced the electrical resistance by about one order of magnitude.

Although the exemplary embodiment illustrated in FIG. 1 illustrates the structure of silicides 46 and 51 and respective regions 37 and 36 being used for transistor 17, the contact structure may be used for other types of semiconductor devices including individual transistors instead of multi-cell transistors, planar transistors, and for other semiconductor devices needing a low resistance electrical connection to two semiconductor regions having different doping types.

Figure 6:
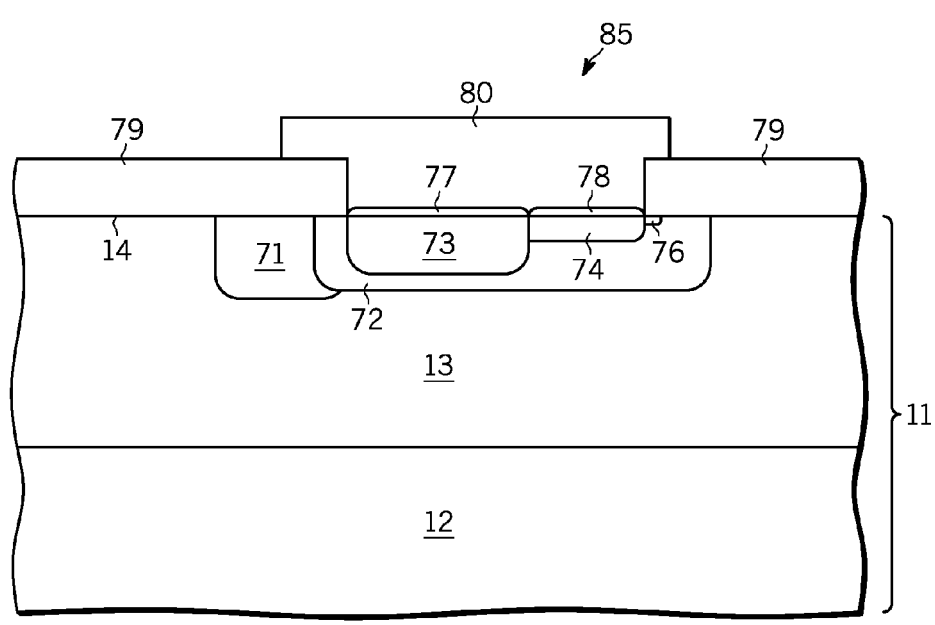
FIG. 6 illustrates an enlarged cross-sectional view of an exemplary embodiment of a portion of another semiconductor device in accordance with the present invention.

FIG. 6 illustrates an enlarged cross-sectional view of an exemplary embodiment of a portion of a semiconductor device 70 having an electrical contact structure 85 that is an alternate embodiment of electrode and contact system 18 explained in the description of FIG. 1-FIG. 5. Semiconductor device 70 usually includes a doped region 71 that assists in increasing the breakdown voltage of device 70. Region 71 is similar to region 24 in FIG. 1-FIG. 5. Device 70 also usually includes a doped region 72 that is formed in substrate 11 and functions as a drift region for a transistor or other semiconductor device that may utilize contact structure 85. Region 72 is similar to region 26 in FIG. 1-FIG. 5. Regions 71 and 72 may be omitted in some embodiments. Device 70 further includes a first doped region 73 and a second doped region 74 that have opposite conductivity types similar to regions 36 and 37 in FIG. 1-FIG. 5. Region 73 is formed to extend a first distance into substrate 11 by doping a first portion of substrate 11, and region 74 is formed to extend a second distance into substrate 11 by doping a second portion of substrate 11 with a conductivity type that is the opposite of the conductivity type of region 73. Typically, region 73 extends further into substrate 11 than region 74. Regions 74 and 73 are formed adjacent to each other and preferably with a portion of regions 73 and 74 overlapping each other. An overlapping portion is illustrated by dashed lines. A first silicide layer or first silicide 77 is formed on at least a portion of region 73. In the preferred embodiment, silicide 77 is similar to silicide 46 in FIG. 1-FIG. 5. A second silicide 78 is formed on a least a portion of region 74. In the preferred embodiment, silicide 78 is similar to silicide 51 in FIG. 1-FIG. 5. A dielectric layer 79 may be formed on substrate 11 and patterned to have an opening that exposes silicides 77 and 78. A conductor material 80 is formed on silicides 77 and 78 to form electrical connection thereto. Conductor 80 is similar to conductor 52 in FIG. 1-FIG. 5. In other embodiments, region 74 may extend a distance into region 73, thus, silicide 78 may extend to overlie region 74. In other embodiments, a recess may be formed in either region 73 or 74 prior to forming respective silicides 77 and 78.

In view of all of the above, it is evident that a novel device and method is disclosed. Included, among other features, is forming a contact structure having a low electrical resistance to a semiconductor structure that has two oppositely doped semiconductor regions that are to have a common electrical connection. The low electrical resistance facilitates using the contact structure to provide local interconnect to portions of the semiconductor structure. Forming a first silicide to the first region and a second silicide to the second region allows forming a silicide for each layer that results in low resistance electrical connection to the respective doped region.

While the subject matter of the invention is described with specific preferred embodiments, it is evident that many alternatives and variations will be apparent to those skilled in the semiconductor arts. Those of average skill in the art will appreciate that the illustrated steps are exemplary only and constitute only a portion of the manufacturing process steps required to form device 10 on semiconductor substrate 11. Similar spacer defined, such as by spacers 48, body contact structures may also be used to reduce body contact sizing below the limits of certain photolithographic tools. The stepped contact can also improve the step coverage of metallization into small contacts without the requirement for tungsten plugs or other filling techniques. Another embodiment would be for local interconnect silicide using a second similar silicide to form the body contact thereby providing a local interconnect and a self aligned contact to both doped regions. Those skilled in the art will also appreciate that the contact structure may also be used for trench type of transistors as well as the planar structure in the illustrated embodiment of transistor 10. A trench transistor will typically have a trench extending from surface 14, through regions 38 and 26, and into region 13. A gate electrode would be formed inside the trench, which enables channel formation on the trench sidewall when the transistor is turned on. For example, a trench type of transistor may omit region 37 and have the source formed by region 38 extended to underlie silicide 46. In such a structure, a portion of silicide 51 may be on a sidewall of the extended region 38, and a second portion of silicide 51 may make contact to body region 36. In some embodiments, a single silicide may be used to contact regions 38 and 36, instead of two silicides.

The invention claimed is:

1. A semiconductor contact comprising:
 a semiconductor substrate having a surface;
 a first doped region of a first conductivity type extending a first distance into the semiconductor substrate;
 a second doped region on the surface of the semiconductor substrate and extending a second distance into the semiconductor substrate wherein a first portion of the second doped region overlaps a first portion of the first doped region;
 a first silicide electrically contacting the first doped region, wherein the first silicide includes a first metal;
 a second silicide electrically contacting the second doped region, wherein the second silicide includes a second metal that is different from the first metal; and
 a conductor material electrically contacting the first silicide and the second silicide.

2. The semiconductor contact of claim 1 wherein the first distance is greater than the second distance and wherein the second doped region overlaps the first doped region.

3. The semiconductor contact of claim 1 wherein the second silicide is on the surface and further including an opening through the second doped region and forming a recess into the first doped region wherein the first silicide is on a portion of the recess.

4. The semiconductor contact of claim 1 wherein the second doped region overlies the first doped region.

5. The semiconductor contact of claim 1 wherein the conductor material physically contacts both the first and second silicides.

6. The semiconductor contact of claim 1 wherein the first silicide physically contacts the first doped region.

7. The semiconductor contact of claim 6 wherein the second silicide physically contacts the second doped region.

\* \* \* \* \*